United States Patent
Liu

(10) Patent No.: US 9,018,990 B2
(45) Date of Patent: Apr. 28, 2015

(54) DUTY CYCLE TUNING CIRCUIT AND METHOD THEREOF

(71) Applicant: Realtek Semiconductor Corp., HsinChu (TW)

(72) Inventor: Ye Liu, HsinChu (CN)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/829,422

(22) Filed: Mar. 14, 2013

(65) Prior Publication Data

US 2014/0118044 A1    May 1, 2014

(30) Foreign Application Priority Data

Oct. 30, 2012 (CN) .......................... 2012 1 0422863

(51) Int. Cl.
*H03L 7/00* (2006.01)
*H03K 5/156* (2006.01)

(52) U.S. Cl.
CPC ..................... *H03K 5/1565* (2013.01)

(58) Field of Classification Search
USPC ............... 327/141, 144–163; 331/15–17; 375/373–376
See application file for complete search history.

(56) References Cited

U.S. PATENT DOCUMENTS

| | | | | |
|---|---|---|---|---|
| 5,614,855 A * | 3/1997 | Lee et al. | ......... | 327/158 |
| 6,642,760 B1 * | 11/2003 | Alon et al. | ......... | 327/158 |
| 6,919,749 B2 * | 7/2005 | Alon et al. | ......... | 327/277 |
| 7,830,189 B2 * | 11/2010 | Abe | ......... | 327/158 |
| 7,912,167 B2 * | 3/2011 | Saeki | ......... | 375/355 |
| 2001/0026179 A1 * | 10/2001 | Saeki | ......... | 327/147 |
| 2006/0238227 A1 * | 10/2006 | Kim et al. | ......... | 327/158 |
| 2007/0177700 A1 * | 8/2007 | Saeki | ......... | 375/371 |
| 2007/0194824 A1 * | 8/2007 | Kumata | ......... | 327/158 |
| 2009/0102523 A1 * | 4/2009 | Kim et al. | ......... | 327/149 |
| 2009/0219067 A1 * | 9/2009 | Kizer | ......... | 327/156 |
| 2010/0060334 A1 * | 3/2010 | Abe et al. | ......... | 327/158 |
| 2012/0223754 A1 * | 9/2012 | Lewis | ......... | 327/158 |
| 2013/0181757 A1 * | 7/2013 | Calabro et al. | ......... | 327/159 |

* cited by examiner

*Primary Examiner* — Brandon S Cole
(74) *Attorney, Agent, or Firm* — Muncy, Geissler, Olds & Lowe, P.C.

(57) ABSTRACT

A duty cycle tuning circuit and a method thereof are provided, in which the duty cycle tuning circuit includes multiple interpolation circuits, an edge detection circuit, and a delay chain. Each interpolation circuit receives multiple phase clocks, and interpolates an interpolation clock from two of the phase clocks. The phase clocks have the same frequency but different phases. The edge detection circuit is connected electrically to the delay chain, and generates an output clock according to an edge of the interpolation clock.

16 Claims, 5 Drawing Sheets

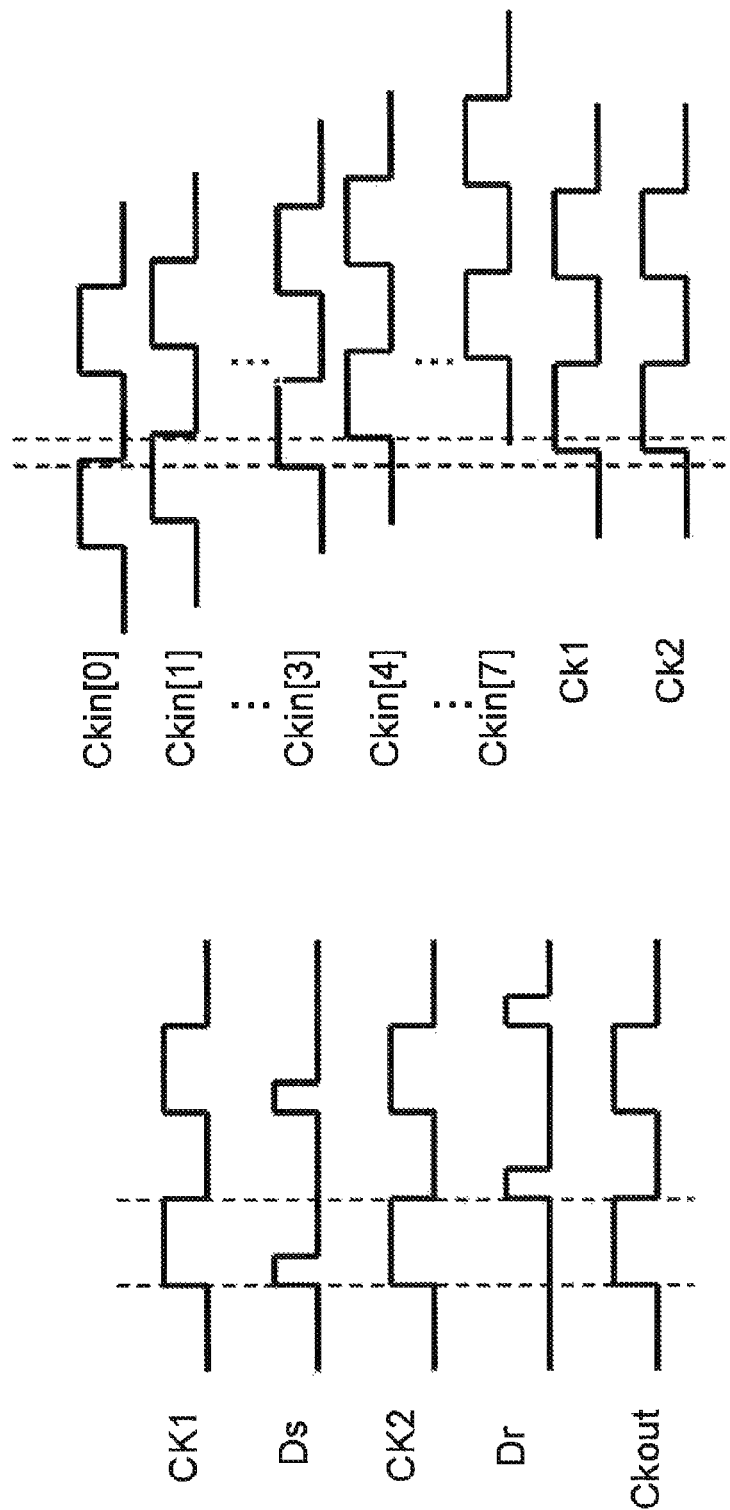

DUTY CYCLE TUNING CIRCUIT AND METHOD THEREOF

CROSS-REFERENCES TO RELATED APPLICATIONS

This non-provisional application claims priority under 35 U.S.C. §119(a) on Patent Application No. 2012104228619 filed in China, P.R.C. on Oct. 10, 2012, the entire contents of which are hereby incorporated by reference.

BACKGROUND OF THE INVENTION

1. Technical Field

The present invention relates to a technology for generating a clock signal having a 50% duty cycle, and more particularly to a duty cycle tuning circuit and a method thereof.

2. Related Art

In many high-speed and high-performance applications, it is required to provide a clock signal having a 50% duty cycle to a system. For example, in a double data rate synchronous dynamic random-access memory (DDR SDRAM) system, a rising edge and a falling edge of a clock signal are used to process data to achieve an objective that the data transmission rate is increased by 100% in the same clock frequency. In this application, the clock signal must have a precise 50% duty cycle; otherwise, timing margin in the data processing is decreased and then the data transmission rate is reduced.

In an ordinary tuning circuit, two delay chains are used to tune the rising edge and the falling edge of the clock signal to make the signal have a 50% duty cycle. However, in this tuning mode, it is difficult to provide a great tuning range (for example, over 10% of the clock cycle of the clock signal). Although the tuning mode may provide a high tuning precision (for example, 1 ps/step), the application range and the output precision of the tuning circuit are limited.

That is, in the tuning method, the delay tuning completely depends on the delay chain. Therefore, the tuning circuit must have a capability of tuning a clock cycle of over ±10%; that is, it is required that the delay tuning range of the delay chain should be greater than 20% of the clock cycle. Taking the DDR SDRAM system for example, to meet the requirements, the delay tuning range of the delay chain is approximately hundreds of picoseconds (ps). Since the delay chain itself has a proportion of fixed delay, an additional part of fixed delay is added when the requirements of the tuning range is met. For example, if the tuning range of the delay chain is from 600 ps to 1 nanosecond (ns), a fixed delay of 600 ps is added to the delay chain itself, when a variable delay of 400 ps is performed on the delay chain. However, an excessively great additional delay is generally not desired in many applications. In addition, since the delay chain itself is significantly affected by external factors (such as, temperature, voltage, and process drift), the delay variation may be two to three times. To meet the requirements of the tuning range in any case, it is required that the maximum delay of the delay chain should be usually over-designed to more than two times of the required tuning range. In this case, the problem of the additional delay of the tuning circuit becomes more serious, and the area and the power consumption of the tuning circuit are also increased. In another aspect, to reach a higher tuning precision, it is required that the tuning resolution of the delay chain should be set to a very small value, for example, 1 ps/step (1 ps is delayed per step). In the case of the great tuning range and the high tuning precision, a great number of unit delay cells are needed, so that the complexity of the tuning circuit is increased significantly, it is also difficult to control the influence of the parasitic effect, and furthermore, the area and the power consumption of the tuning circuit are increased.

SUMMARY

In some embodiments, a duty cycle tuning circuit includes multiple interpolation circuits, an edge detection circuit, and a delay chain.

Each interpolation circuit receives multiple phase clocks, and interpolates an interpolation clock from two of the multiple phase clocks. The multiple phase clocks have the same frequency but different phases. The edge detection circuit is connected electrically to the delay chain, and generates an output clock according to an edge of each interpolation clock.

In some embodiments, a duty tuning method includes: providing two interpolation clocks, based on a multiphase clock signal, by using a phase interpolation method; respectively controlling a rising edge and a falling edge of an output clock by using the two interpolation clocks; and outputting the controlled output clock.

To sum up, in the duty cycle circuit and the method thereof according to the present invention, coarse tuning of the duty cycle is performed by using the phase interpolation method, and fine tuning of the duty cycle is performed by using the delay chain, so as to obtain an output clock having a 50% duty cycle. In some embodiments, the tuning range of the fine tuning may be reduced by using the coarse tuning of the phase interpolation method, thereby relatively reducing the units required by the delay chain. In some embodiments, since an interpolation circuit with high stability is used to reduce the scale of the delay chain, complexity, area, and power consumption of the tuning circuit may be relatively reduced.

BRIEF DESCRIPTION OF THE DRAWINGS

The present invention will become more fully understood from the detailed description given herein below for illustration only, and thus not limitative of the present invention, wherein:

FIG. 2 is a timing diagram of related signals of an edge detection circuit in FIG. 1;

FIG. 3 is a timing diagram of related signals of an interpolation circuit in FIG. 1;

DETAILED DESCRIPTION

Figure 1:
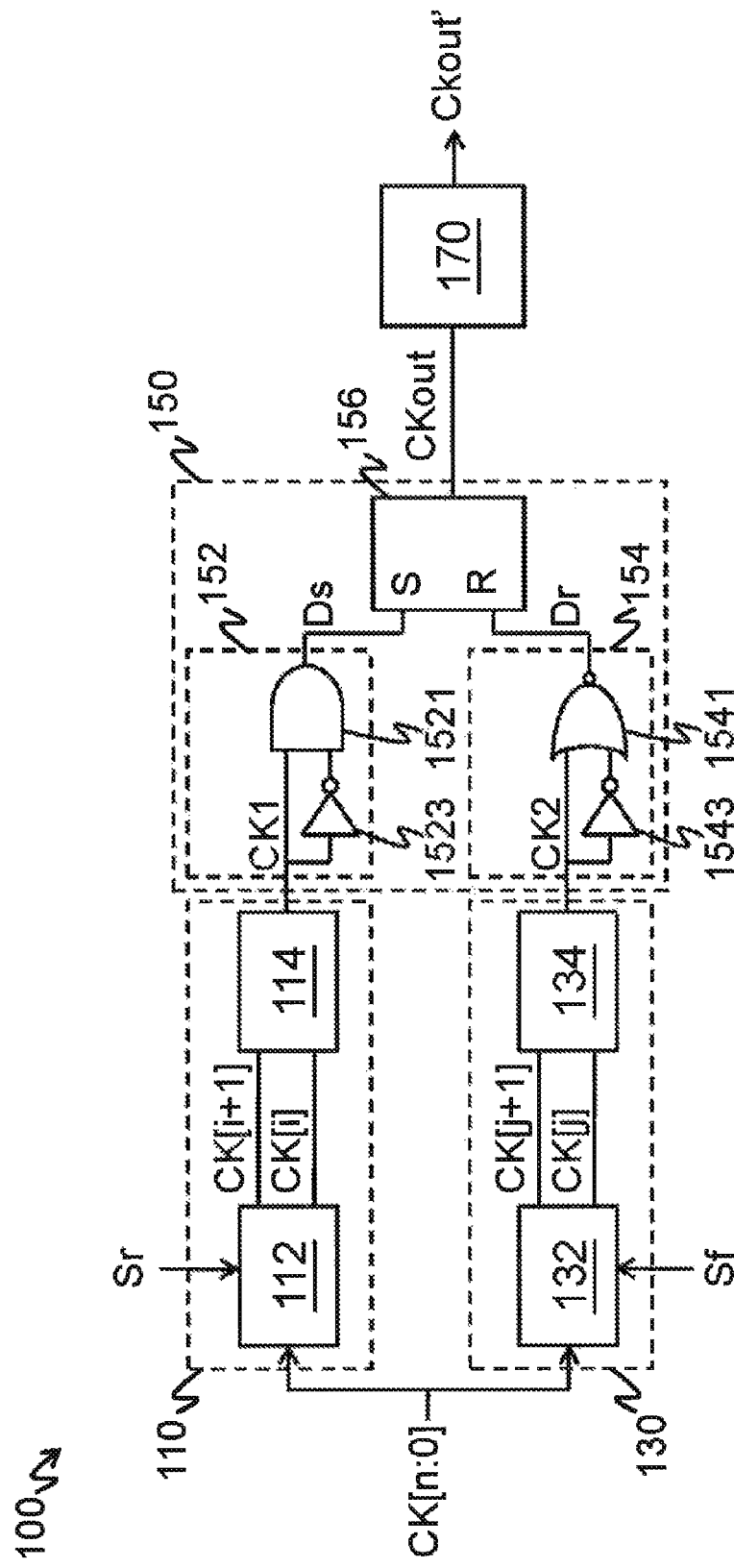
FIG. 1 is a schematic diagram of a duty cycle tuning circuit according to a first embodiment of the present invention.

The terms "first" and "second" in the following description are used to differentiate elements indicated by the terms, and are not used to indicate a sequence or limit the difference of the elements indicated by the terms, and are not used to limit the protection scope of the present invention.

A duty cycle tuning circuit provided in the present invention includes multiple interpolation circuits, an edge detection circuit, and a delay chain. To facilitate the description, please refer to FIG. 1, the description is made through an embodiment having two interpolation circuits (called a first interpolation circuit 110 and a second interpolation circuit 130).

The first interpolation circuit 110 is coupled to an input end of the edge detection circuit 150, and the second interpolation circuit 130 is coupled to the other input end of the edge detection circuit 150. A delay chain 170 is connected electrically to the edge detection circuit 150. In this embodiment, the delay chain 170 is coupled to an output end of the edge detection circuit 150.

A multiphase clock signal CK[n:0] is input into the first interpolation circuit 110 and the second interpolation circuit 130. The phase signal CK[n:0] is n phase clocks having the same frequency but different phases, in which n is an integer greater than 1.

The first interpolation circuit 110 interpolates an interpolation clock CK1 by using phase clocks CK[i] and CK[i+1] in the clock signal CK[n:0] (that is, n phase clocks), in which i is any integer between 0 and n, and the phase clocks CK[i] and CK[i+1] are any two of the n phase clocks with the adjacent phases.

The second interpolation circuit 130 also interpolates an interpolation clock CK2 by using two phase clocks CK[j] and CK[j+1] in the clock signal CK[n:0], in which n is any integer between 0 and n. In some embodiments, the two phase docks CK[j] and CK[j+1] are any two of the n phase clocks with the adjacent phases.

The edge detection circuit 150 receives the interpolation clocks CK1 and CK2, and detects edges of the interpolation clocks CK1 and CK2, so as to generate an output clock CKout according to edge triggering of the interpolation clocks CK1 and CK2. In some embodiments, the edge detection circuit 150 detects triggering of a rising edge of the interpolation clock CK1 and triggering of a falling edge of the interpolation clock CK2, so as to obtain the output clock CKout. In other words, the rising edge of the output clock CKout is corresponding to the rising edge of the interpolation clock CK1, and the falling edge of the output clock CKout is corresponding to the falling edge of the interpolation clock CK2.

In this case, fine tuning is performed on the duty cycle of the output clock CKout by using the delay chain 170. The delay chain 170 receives and delays the output clock CKout to output a delayed output clock CKout'. In this manner, the delayed output clock CKout' has a 50% duty cycle.

In some embodiments, Please refer to FIG. 1 and FIG. 2, the edge detection circuit 150 may have multiple logic circuits and a latch 156. The logic circuits are corresponding to the interpolation circuits respectively. Each logic circuit is mainly formed by logic elements. To facilitate the description, the description is made in the following through two logic circuits (called a first logic circuit 152 and a second logic circuit 154 respectively).

The first logic circuit 152 is corresponding to the first interpolation circuit 110, and the second logic circuit 154 is corresponding to the second interpolation circuit 130. Here, the first logic circuit 152 is coupled between the first interpolation circuit 110 and the latch 156, and the second logic circuit 154 is coupled between the second interpolation circuit 130 and the latch 156.

The first logic circuit 152 receives the interpolation clock CK1, and detects the rising edge of the interpolation clock CK1. The second logic circuit 154 receives the interpolation clock CK2, and detects the falling edge of the interpolation clock CK2.

Two input ends of the latch 156 receive output (called a first logic signal Ds), of the first logic circuit 152 and output (called a second logic signal Dr), of the second logic circuit 154 respectively, and make a response to the first logic signal Ds and the second logic signal Dr to generate an output clock CKout.

In some embodiments, the first logic circuit 152 may include an AND gate 1521. Two input ends of the AND gate 1521 respectively receive an interpolation clock CK1 and a phase inverted interpolation clock CK1. The AND gate 1521 performs logic operation on the interpolation clock CK1 and the phase inverted interpolation clock CK1, so as to generate the first logic signal Ds. A phase inverter 1523 may be used to perform complement operation on the interpolation clock CK1 to generate the phase inverted interpolation clock CK1.

The second logic circuit 154 may include a NOR gate 1541. Two input ends of the NOR gate 1541 receive an interpolation clock CK2 and a phase inverted interpolation clock CK2 respectively. The NOR gate 1541 performs logic operation on the interpolation clock CK2 and the phase inverted interpolation clock CK2, so as to generate a second logic signal Ds. A phase inverter 1543 may be used to perform complement operation on the interpolation clock CK2 to generate the phase inverted interpolation clock CK2.

The latch 156 may be an RS latch. A set input S of the RS latch receives output Ds of the AND gate 1521, and a reset input R of the RS latch receive output Dr of the NOR gate 1541.

In some embodiments, Please refer to FIG. 1, circuit components of each interpolation circuit are approximately the same. The interpolation circuits perform the coarse tuning of the duty cycle of the clock signal CK[n:0] by using the phase interpolation method, so as to generate the interpolation clock CK1 used to control the rising edge of the output clock CKout and the interpolation clock CK2 used to control the falling edge of the output clock CKout. In some embodiments, the tuning resolution of each interpolation circuit is a 1/256=0.5% clock cycle of the clock signal CK[n:0]. For example, if the frequency of the clock signal CK[n:0] is 800 MHz, the tuning resolution of the coarse tuning is 4.9 ps.

Each interpolation circuit may include a selection unit and a phase interpolator. In other words, the first interpolation circuit 110 includes a first selection unit 112 and a first phase interpolator 114. The second interpolation circuit 130 includes a second selection unit 132 and a second phase interpolator 134.

The first phase interpolator 114 is coupled between the first selection unit 112 and the edge detection circuit 150. The first selection unit 112 receives n phase clocks (that is, the clock signal CK[n:0]) and the control signal Sr, and selects, according to the first control signal Sr, two phase signals CK[i] and CK[i+1] from the n phase clocks. The first phase interpolator 114 receives the two phase clocks CK[i] and CK[i+1] selected by the first selection unit 112, and interpolates the interpolation clock CK1 by using the two phase clocks CK[i] and CK[i+1].

The second phase interpolator 134 is coupled between the second selection unit 132 and the edge detection circuit 150. The second selection unit 132 receives n phase clocks (that is, the clock signal CK[n:0]) and the control signal ST, and selects, according to the control signal Sf, two phase clocks CK[j] and CK[j+1] from the n phase clocks. The second phase interpolator 134 receives the two phase clocks CK[j] and CK[j+1] selected by the second selection unit 132, and interpolates the interpolation clock CK2 by using the two phase clocks CK[i] and CK[j+1]. In some embodiments, i is equal to j.

Please refer to FIG. 1 and FIG. 3, in which for example, n is equal to 7 (that is the clock signal CK[7:0] is eight phase clocks CK[0], CK[1]-CK[3], and CK[4]-CK[7]) and the tuning resolution of each interpolation circuit is a 1/256 clock cycle, it is assumed that the values of both of the two control signals Sr and Sf are 100, the interpolation clock output by each interpolation circuit is 100/256 of a clock cycle. At this time, the selection unit selects the fourth phase clock CK[3] and the fifth phase clock CK[4] from the clock signal CK[7:0]. The phase interpolator interpolates the fourth phase clock CK[3] and the fifth phase clock CK[4]. In the phase interpolator, the fourth phase clock CK[3] has a driving strength of 28/32, and the fifth phase clock CK[4] has a driving strength of 4/32. Therefore, the phase interpolator may generate a delayed interpolation clock equivalent to a 100/256 clock cycle of the clock signal CK[7:0].

When basic functions of the phase interpolator are normal, the delay tuning range of the phase interpolator on the interpolation clock only relates to the value of the control signal, and does not relate to external factors such as temperature, voltage, and process. Therefore, compared with the tuning mode of the delay chain, the phase interpolator is capable of providing a stable tuning range not affected by the external factors. For example, if the tuning range of the output delay is set to ±12.5%, the tuning range of the phase interpolator is basically not changed when factors such as temperature, voltage, and process are changed, but the tuning range of the delay chain is changed by more than two times when the external factors are changed.

Figure 4:
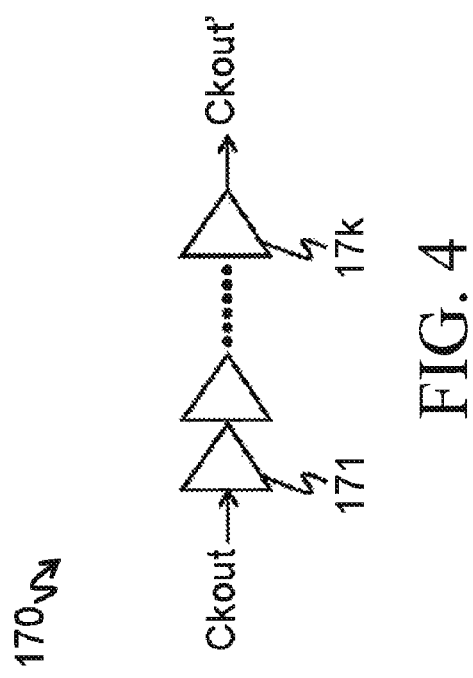
FIG. 4 is a schematic diagram of a delay chain according to an embodiment.

In some embodiments, please refer to FIG. 4, in which the delay chain 170 includes at least one delay cell 171-17k, in which k is a positive integer. Since the delay cell is known to persons skilled in the art, the details are not described herein.

Figure 5:
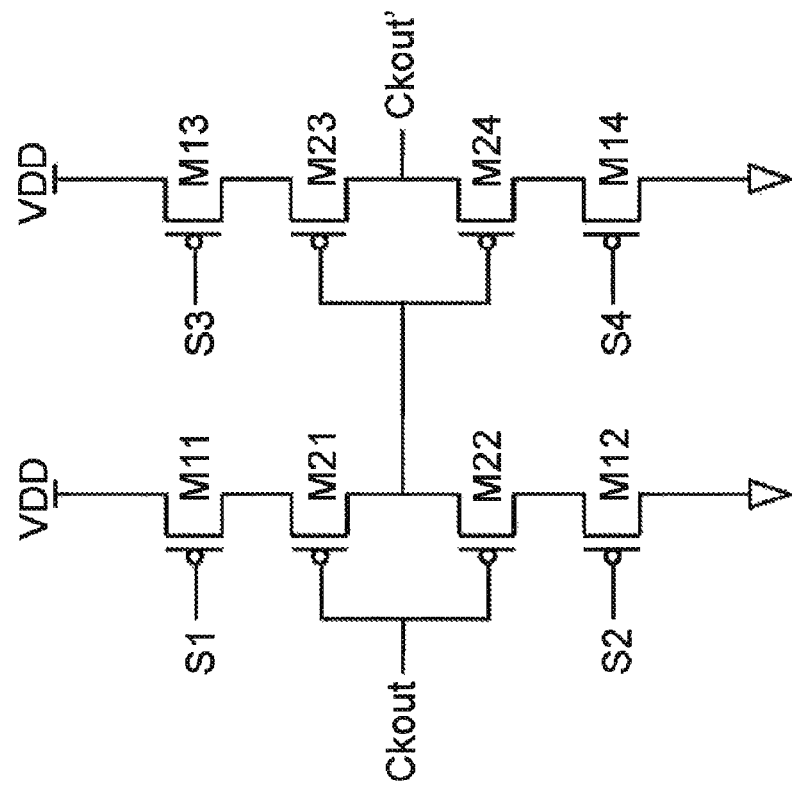
FIG. 5 is a schematic diagram of a delay chain according to another embodiment.

In some embodiments, please refer to FIG. 5, in which the delay chain 170 includes a plurality of current sources, a first transistor M21, a second transistor M22, a third transistor M23, and a fourth transistor M24. Each current source may include at least one transistor. When each current source includes multiple transistors, the transistors in each current source are arranged in parallel connection. To facilitate the description, the description is made in the following through an example with four current sources called a first current source M11, a second current source M12, a third current source M13, and a fourth current source M14 respectively.

A first end of the first current source M11 is coupled to a voltage source VDD, and a second end of the first current source M11 is coupled to a first end of the first transistor M21. A control end of the first current source M11 receives a first signal S1, so that the first signal S1 controls operation of the first current source M11.

A second end of the first transistor M21 is coupled to a first end of the second transistor M22, a control end of the third transistor M23, and a control end of the fourth transistor M24. A control end of the first transistor M21 and a control end of the second transistor M22 are connected to an output end of the latch 156 (the edge detection circuit 150), to receive the output clock CKout, so that the output clock CKout controls operation of the first transistor M21 and the second transistor M22.

A first end of the second current source M12 is coupled to a second end of the second transistor M22, and a second end of the second current source M12 is grounded. A control end of the second current source M12 receives a second signal S2, so that the second signal S2 controls operation of the second current source M12.

A first end of the third current source M13 is coupled to the voltage source VDD, and a second end of the third current source M13 is connected to a first end of the third transistor M23. A control end of the third current source M13 receives a third signal S3, so that the third signal S3 controls operation of the third current source M13.

A second end of the third current source M23 is coupled to a first end of the fourth transistor M24, and a second end of the fourth transistor M24 is coupled to a first end of the fourth current source M14.

A second end of the fourth current source M14 is grounded, and a control end of the fourth current source M14 receives a fourth signal S4, so that the fourth signal S4 controls operation of the fourth current source M14.

In some embodiments, when the first signal S1 and the four signal S4 are variable values and the second signal S2 and the third signal S3 are fixed values, the delay chain 170 may delay the falling edge of the output clock CKout. On the contrary, when the first signal S1 and the four signal S4 are fixed values and the second signal S2 and the third signal S3 are variable values, the delay chain 170 may delay the rising edge of the output clock CKout.

In some embodiments, the delay chain 170 may delay the falling edge of the output clock CKout, by changing sizes of the first current source M11 and the fourth current source M14. For example, the number of transistors which are ON in the first current source M11 and the fourth current source M14 is controlled by using the first signal S1 and the fourth signal S4 respectively, so that the delay chain 170 delays the corresponding time of the falling edge of the output clock CKout.

In some embodiments, the delay chain 170 may delay the rising edge of the output clock CKout, by changing sizes of the second current source M12 and the third current source M13. For example, the number of transistors which are ON in the second current source M12 and the third current source M13 is controlled by using the second signal S2 and the third signal S3 respectively, so that the delay chain 170 delays the corresponding time of the rising edge of the output clock CKout.

In some embodiments, the delay chain 170 may be set between the interpolation circuit and the edge detection circuit 150.

Figure 6:
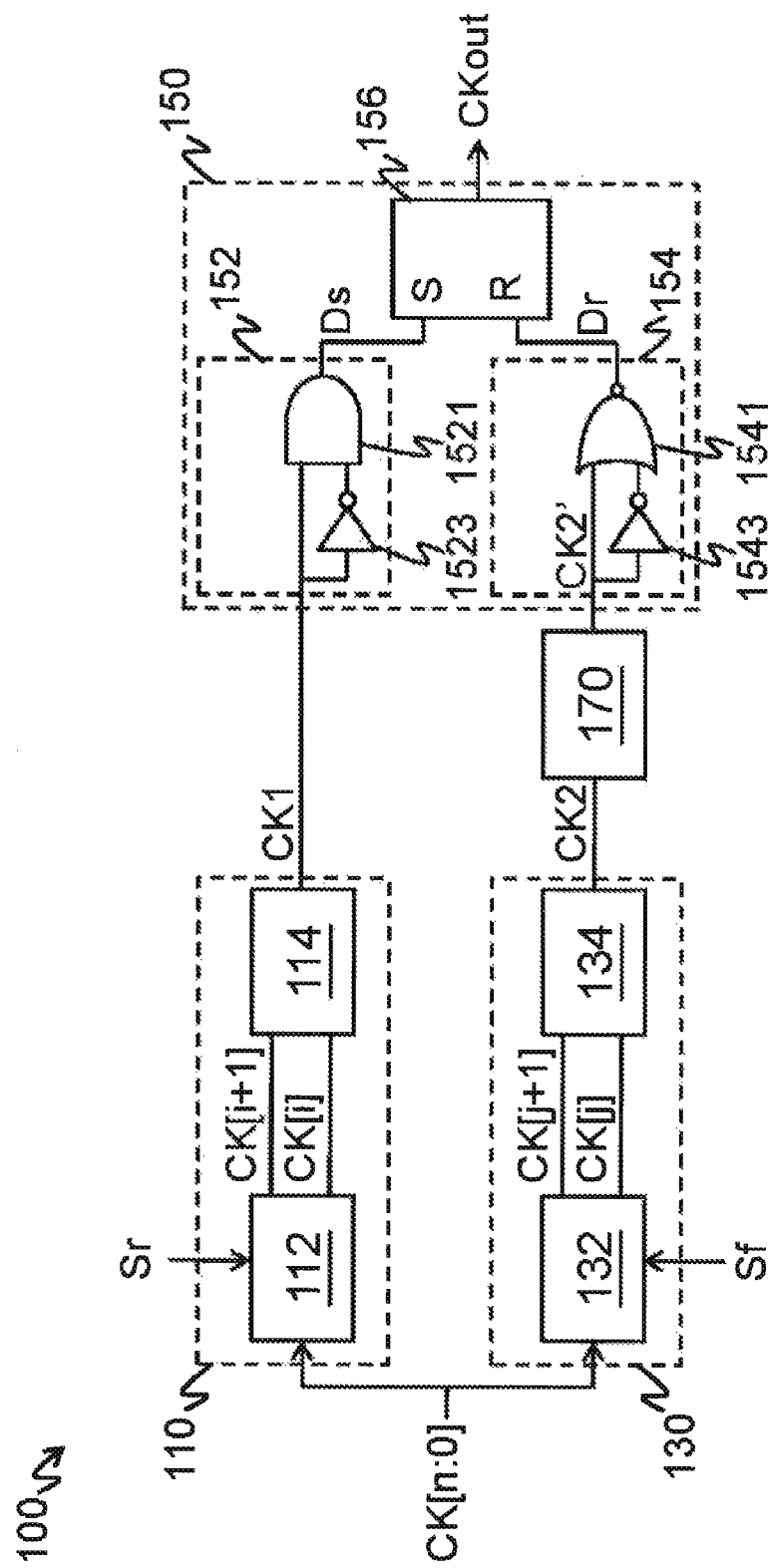
FIG. 6 is a schematic diagram of a duty cycle tuning circuit according to a second embodiment of the present invention.

Please refer to FIG. 6, in which the delay chain 170 is coupled between the second interpolation circuit 130 and the edge detection circuit 150, so as to perform the fine tuning of the falling edge. The delay chain 170 receives the interpolation clock CK2 and performs the delay processing on the interpolation clock CK2 to output the delayed interpolation clock CK2'. Then, the edge detection circuit 150 detects the edge triggering of the interpolation clock CK1 and the edge triggering of the delayed interpolation clock CK2 to generate the output clock CKout. After the tuning of the control signals Sr and Sf and the delaying of the delay chain, the output clock CKout output by the edge detection circuit 150 may have a 50% duty cycle.

Figure 7:
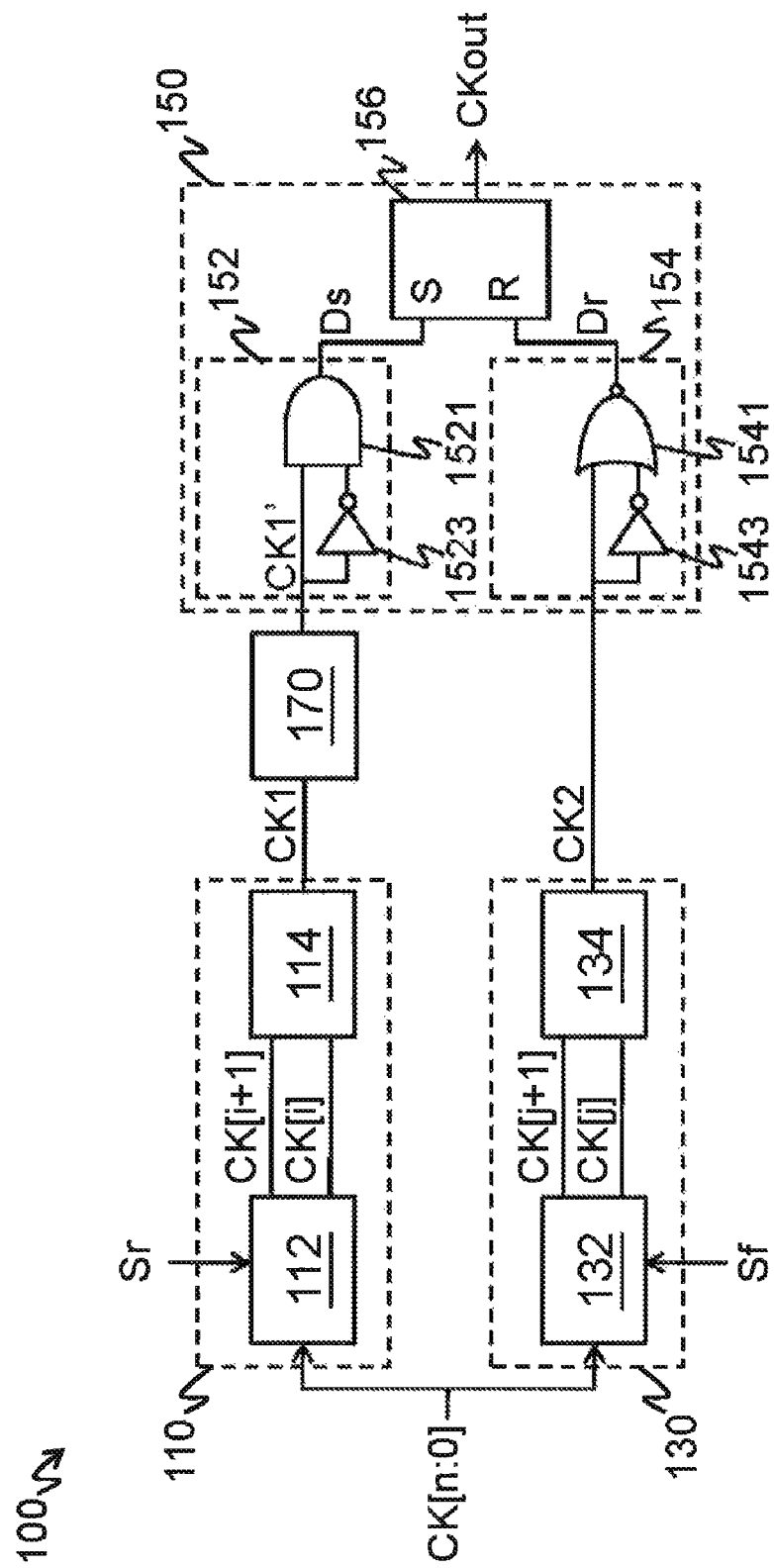
FIG. 7 is a schematic diagram of a duty cycle tuning circuit according to a third embodiment of the present invention.

In addition, please refer to FIG. 7, in which the delay chain 170 may be also coupled between the first interpolation circuit 110 and the edge detection circuit 150, so as to perform the fine tuning of the rising edge. The delay chain 170 receives the interpolation clock CK1 and performs the delay processing on the interpolation clock CK1 to output the delayed interpolation clock CK1'. Then, the edge detection circuit 150 detects the edge triggering of the delayed interpolation clock CK1' and the edge triggering of the interpolation clock CK2 to generate the output clock CKout. After the tuning of the control signals Sr and Sf and the delaying of the delay chain, the output clock CKout output by the edge detection circuit 150 may have a 50% duty cycle.

To summarize, in the duty cycle circuit and the method thereof according to the present invention, the coarse tuning of the duty cycle is performed by using the phase interpolation method, and the fine tuning is performed by using the delay chain, so as to obtain an output clock having a 50% duty cycle. In some embodiments, the tuning range of the fine tuning may be reduced by using the coarse tuning of the phase interpolation method, thereby relatively reducing the units required by the delay chain. In some embodiments, since an interpolation circuit with high stability is used to reduce the scale of the delay chain, complexity, area, and power consumption of the tuning circuit may be relatively reduced.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A duty cycle tuning circuit, comprising:
    a plurality of interpolation circuits, each for receiving a plurality of phase clocks of a multiphase clock signal, and interpolating an interpolation clock from two phase clocks with adjacent phases of the phase clocks of the multiphase clock signal, wherein the phase clocks have the same frequency but different phases;
    an edge detection circuit, for generating an output clock according to an edge of the interpolation clocks, a rising edge of the output clock corresponding to an edge of one of the interpolation clocks, and a falling edge of the output clock corresponding to an edge of another one of the interpolation clocks; and
    a delay chain, connected electrically to the edge detection circuit.

2. The duty cycle tuning circuit according to claim 1, wherein each interpolation circuit comprises:
    a selection unit, for selecting two phase signals with the adjacent phases from the phase clocks according to a control signal; and
    a phase interpolator, for interpolating the interpolation clock by using the two selected phase clocks.

3. The duty cycle tuning circuit according to claim 1, wherein the edge detection circuit comprises:
    a plurality of logic circuits, corresponding to the interpolation circuits, respectively, for detecting one of a rising edge and a falling edge of the corresponding interpolation clock, respectively; and
    a latch, for generating the output clock based on output of the logic circuits.

4. The duty cycle tuning circuit according to claim 3, wherein the delay chain is connected electrically to an output end of the latch, to delay the output clock.

5. The duty cycle tuning circuit according to claim 3, wherein the logic circuits comprise:
    a first logic circuit, connected electrically between the corresponding interpolation circuit and the latch, for detecting detect the rising edge of the corresponding interpolation clock; and
    a second logic circuit, connected electrically between the corresponding interpolation circuit and the latch, for detecting the falling edge of the corresponding interpolation clock.

6. The duty cycle tuning circuit according to claim 1, wherein the delay chain is connected electrically between one of the interpolation circuits and the edge detection circuit, to delay the corresponding interpolation clock.

7. The duty cycle tuning circuit according to claim 6, wherein the edge detection circuit comprises:
    a first logic circuit, connected electrically to another one of the interpolation circuits, for detecting a rising edge of the corresponding interpolation clock;
    a second logic circuit, connected electrically to the delay chain, for detecting a falling edge of the delayed interpolation clock; and
    a latch, for generating the output clock based on output of the first logic circuit and the second logic circuit.

8. The duty cycle tuning circuit according to claim 6, wherein the edge detection circuit comprises:
    a first logic circuit, connected electrically to the delay chain, for detecting a rising edge of the delayed interpolation clock;
    a second logic circuit, connected electrically to another one of the interpolation circuits, for detecting a falling edge of the corresponding interpolation clock; and
    a latch, for generating the output clock based on output of the first logic circuit and the second logic circuit.

9. The duty cycle tuning circuit according to claim 1, wherein the delay chain comprises at least one delay cell in serial connection.

10. The duty cycle tuning circuit according to claim 1, wherein the delay chain comprises: a plurality of transistors, for delaying the output clock according to a first signal, a second signal, and a third signal, to output the delayed output clock.

11. A duty cycle tuning method, comprising:
    providing two interpolation clocks, based on a multiphase clock signal, by using a phase interpolation method, wherein each of the interpolation clocks originates from two clocks with adjacent phases of the multiphase clock signal;
    respectively controlling a rising edge and a falling edge of an output clock by using the interpolation clocks, the rising edge of the output clock corresponds to an edge of one of the interpolation clocks, and the falling edge of the output clock corresponds to an edge of another one of the interpolation clocks; and
    outputting the controlled output clock.

12. The duty cycle tuning method according to claim 11, wherein the control step comprises:
    detecting triggering of the rising edge and the falling edge of the interpolation clocks to generate the output clock respectively.

13. The duty cycle tuning method according to claim 12, wherein the detection step comprises:
    logically detecting the rising edge of one of the interpolation clocks to generate a first logic signal;
    logically detecting the falling edge of another one of the interpolation clocks to generate a second logic signal; and
    making a response to the first logic signal and the second logic signal by using a latch to generate the output clock.

14. The duty cycle tuning method according to claim 11, wherein the output step comprises:
    delaying the controlled output clock by using a delay chain; and
    outputting the delayed output clock.

15. The duty cycle tuning method according to claim 11, wherein the step of providing each interpolation clock comprises:
    receiving a plurality of phase clocks of the multiphase clock signal, wherein the phase clocks have the same frequency but different phases;

selecting the two clocks with the adjacent phases of the phase clocks; and interpolating the two selected interpolation clocks to generate the interpolation clock.

16. The duty cycle tuning method according to claim 15, wherein the step of providing each interpolation clock further comprises:

delaying the generated interpolation clock by using a delay chain.

* * * * *